United States Patent [19]

Willis

[11] Patent Number: 4,507,707
[45] Date of Patent: Mar. 26, 1985

[54] ELECTRO-PNEUMATIC ASSEMBLY DEVICE

[76] Inventor: John G. Willis, 5 Rio Grande Dr., Chelmsford, Mass. 01824

[21] Appl. No.: 336,015

[22] Filed: Dec. 30, 1981

[51] Int. Cl.³ .............................................. H05K 1/14
[52] U.S. Cl. ..................... 361/380; 339/15; 137/884; 73/756; 285/137 R; 361/331; 361/415
[58] Field of Search ...................... 339/15, 16 R, 16 C; 137/884; 285/137 R; 73/756; 200/81.4, 81 R, 81.9 R, 82 R; 361/331, 380, 384, 392–395, 397, 412, 399, 413, 415, 429

[56] References Cited

U.S. PATENT DOCUMENTS

| | | | |
|---|---|---|---|
| 3,917,370 | 11/1975 | Thornton | 339/16 R |
| 4,032,821 | 6/1977 | Keiser | 285/137 R |
| 4,095,864 | 6/1978 | Hardin | 137/884 |
| 4,133,022 | 1/1979 | Moore | 339/16 R |

OTHER PUBLICATIONS

Robitech Inc., Medford, Mass., Model 980-4000, Addressable Four Valve Module.

Primary Examiner—G. P. Tolin

[57] ABSTRACT

There is described an electro-pneumatic assembly device including a rack for receiving mounting boards, a removable mounting board for supporting components and having a set of electric edge connectors along an edge thereof. An elongated pneumatic manifold is split lengthwise into a stationary and a removable fragment, the stationary fragment being affixed to the rack and the removable being affixed to the board.

3 Claims, 3 Drawing Figures

ELECTRO-PNEUMATIC ASSEMBLY DEVICE

BACKGROUND OF THE INVENTION

The invention relates to electro-pneumatic assembly.

Mounting boards carrying both electronic and pneumatic control elements have been designed which establish both electric and pneumatic connections when the board is inserted into a rack or motherboard. These have required connections to be made between interface elements and control elements mounted on the board. Such connections entail assembly costs and result in numerous tubing loops over the board which are susceptable to snagging when the board is inserted or removed from the rack.

SUMMARY OF THE INVENTION

The invention features an electro-pneumatic assembly device including a rack for receiving mounting boards, a removable mounting board for supporting components and having a set of electric edge connectors along an edge thereof. An elongated pneumatic manifold is split lengthwise into a stationary and a removable fragment, the stationary fragment being affixed to the rack and the removable being affixed to the board. The stationary fragment has a source port for receiving air from a source affixed to the rack and a plurality of requirement ports for delivering controlled air requirements to points on the rack. The stationary and removable fragments have opposed mating interfaces extending along their long dimensions. The stationary fragment has in its mating interface a plurality of requirement orifices each communicating with a corresponding requirement port of the stationary fragment, and a source orifice communicating with the source port. The removable fragment has orifices in its mating interface corresponding to and opposing the orifices in the mating interface of the stationary fragment. The removable fragment has a delivery channel communicating with the orifice in the removable fragment opposing the source orifice of the stationary fragment, and a plurality of control device ports communicating with the delivery channel and providing means for attachment of and the delivery of source air to a control device. The removable fragment has a receiving port associated with each device port for receiving controlled air from a control device and communicating with an associated orifice in the mating interface of the removable fragment. The assembly device inludes a seal associated with each pair of opposed orifices effective in completing a channel for passage of air from one opposed orifice to its opposed counterpart when the board is inserted into said rack.

The invention may additionally feature a mechanism for clamping said fragments in a closely opposed position; a control device port which is a center threaded hole; a pneumatic control device attached directly to the removable fragment by screwing into the threaded hole; a removable fragment shaped so that when the device is screwed into the threaded hole a surface of the device will be opposed to a surface of the removable fragment containing the receiving port, with the threaded hole providing a channel for source air for the control device; delivery of controlled air from the device being provided by an off-center hole in the device positioned a distance from the center threaded hole equal to the distance between the control device port and its associated receiving port; an inner circular seal positioned between the device and the removable fragment and circumscribing said threaded hole but not said off-center hole and an outer circular seal positioned between the device and the removable fragment circumscribing said off-center hole providing a channel for flow of air between the off-center hole and its associated receiving port.

DESCRIPTION OF A PREFERRED EMBODIMENT

Figure 1:
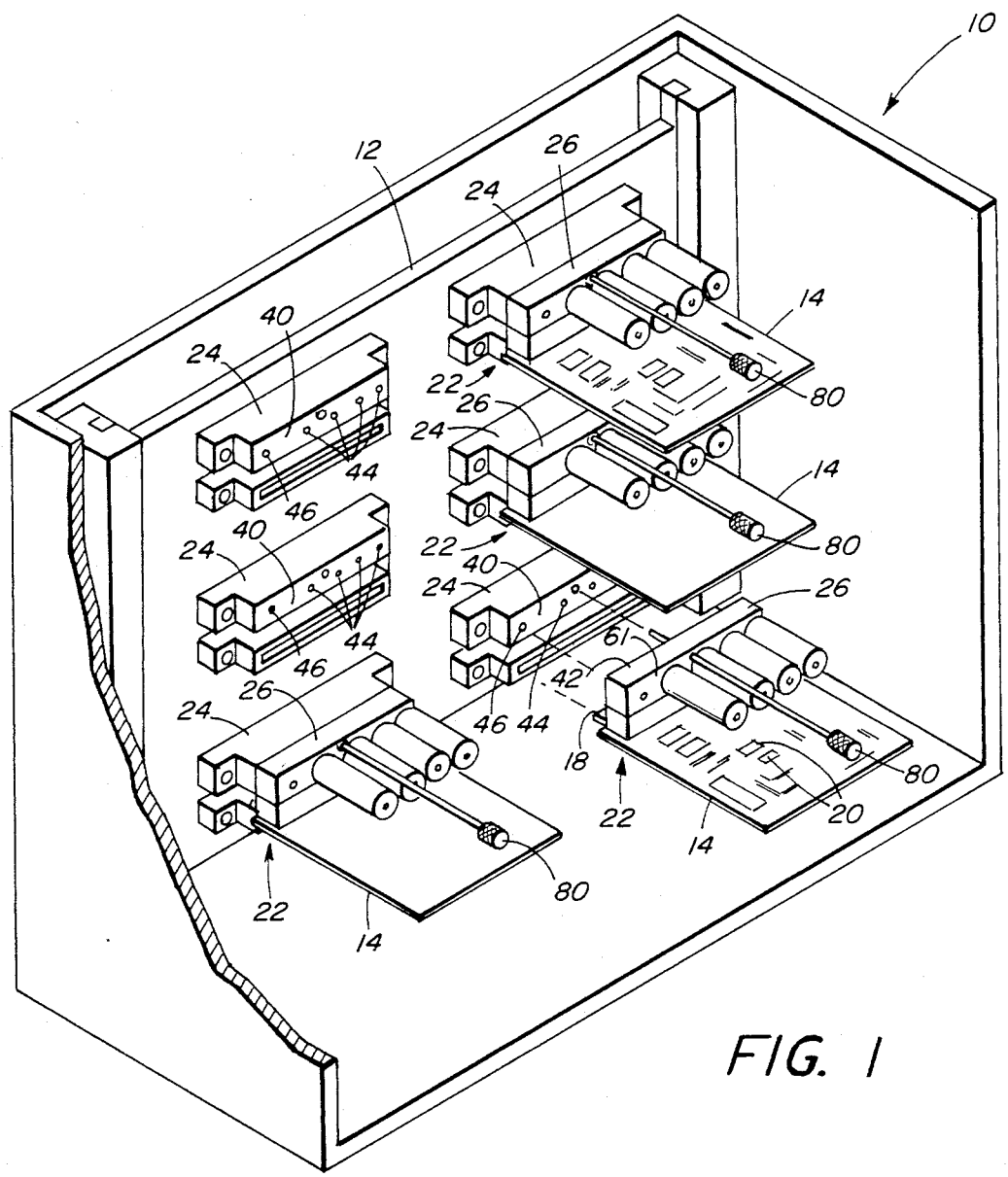
FIG. 1 shows a rack and several mounting boards with electro-pneumatic assembly devices according to the invention.
Figure 3:
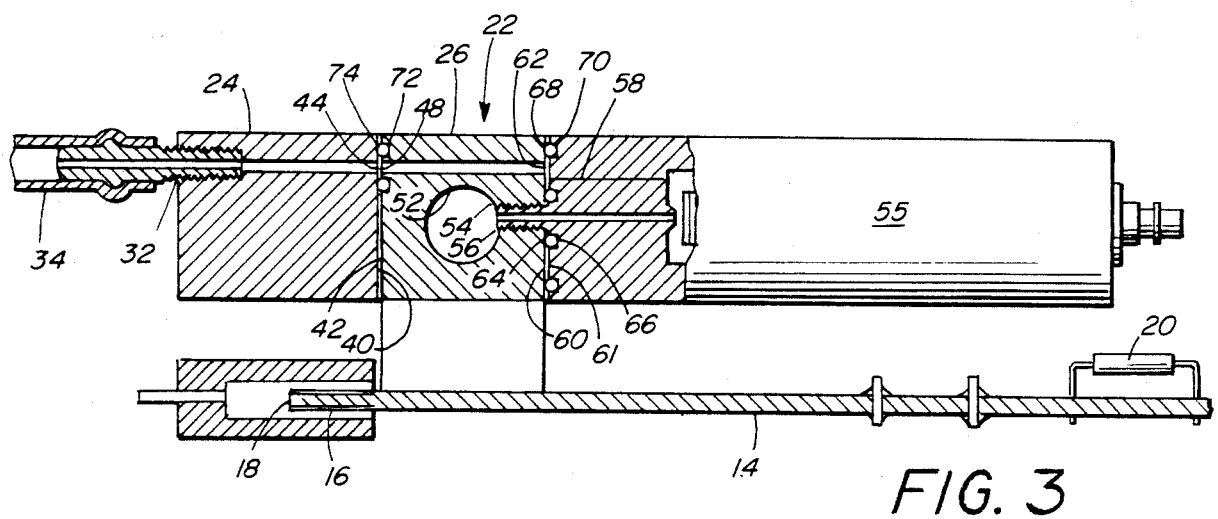
FIG. 3 shows a cross sectional view of the board of FIG. 2 with a device according to the invention, the board being inserted into the rack.
Figure 2:
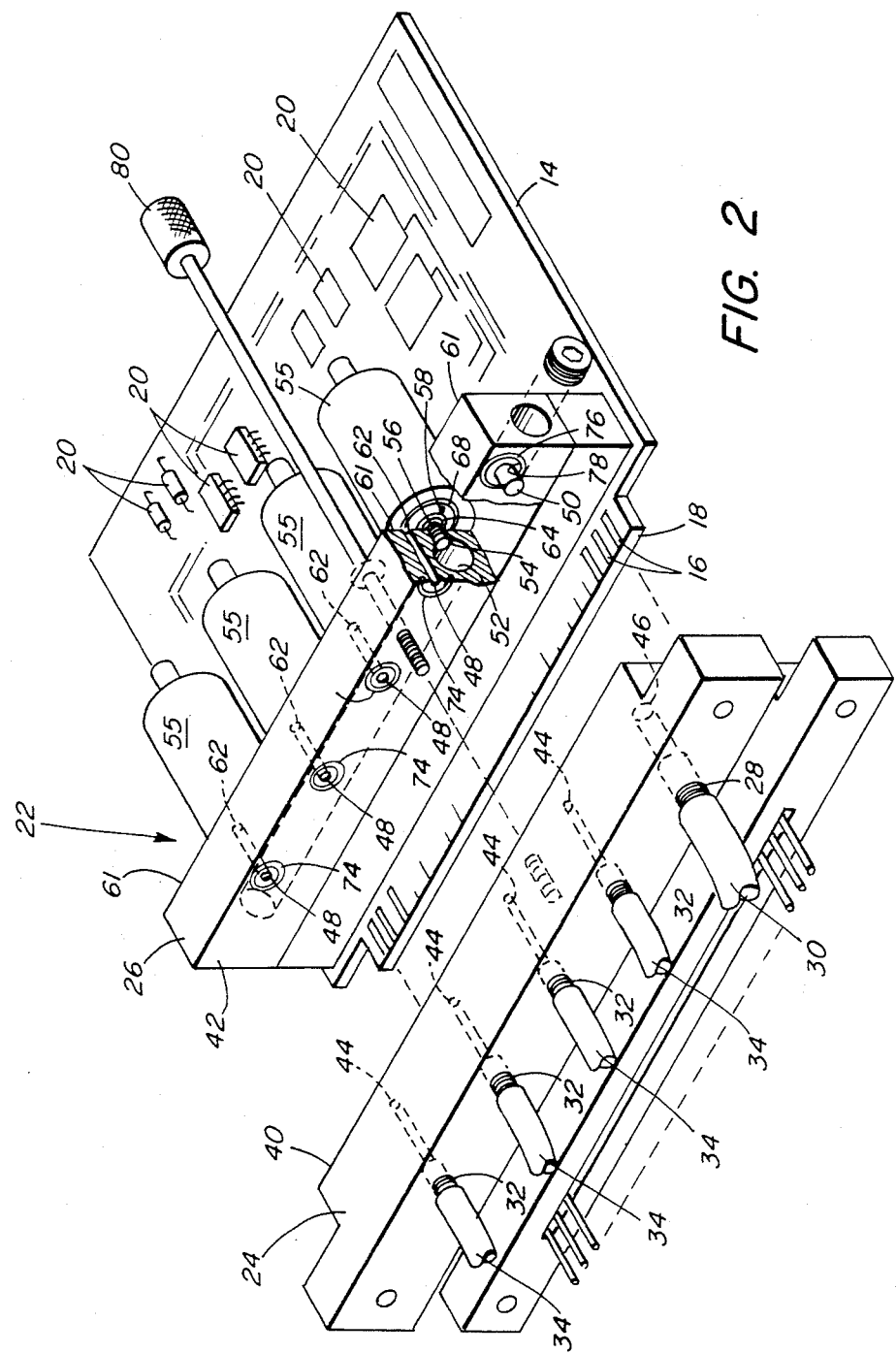
FIG. 2 shows at enlarged scale a mounting board and portion of a rack employing a device according to the invention, the board being in position to be inserted into the rack.

Referring to the Figures, electro-pneumatic assembly device 10 includes rack 12 and removable mounting boards 14. Each mounting board 14 has a set of electric edge connectors 16 along edge 18 and supports components 20. Elongated pneumatic manifold 22 is split longitudinally into a stationary fragment 24 affixed to rack 12 and a removable fragment 26 affixed to board 14. Stationary fragment 24 has a source port 28 connected by tubing 30 to a source of compressed air, and several requirement ports 32 connected by tubing 34 to points in rack 12 where controlled air is required.

Fragments 24 and 26 have mutually mating interfaces 40 and 42 respectively, extending along the long dimensions of the fragments. Mating surface 40 has several requirement orifices 44 each communicating with a corresponding requirement port 32 and a source orifice 46 communicating with source port 28. Removable fragment 26 has in its interface 42 several requirement orifices 48 opposed to the requirement orifices 44 in the stationary fragment and a source orifice 50 opposed to the source orifice 46 in the stationary fragment. Removable fragment 26 has a distribution channel 52 communicating with source orifice 50. Threaded device ports 54 communicate with source distribution channel 52, and serve for attachment of pneumatic control devices 55, such as pneumatic amplifiers or electrically controlled valves.

Control devices 55 have threaded nipples 56 which are screwed into ports 54 with the supply of air to the attached control device passing through the threaded hole and nipple. Each control device 55 has delivery port 58 for delivery of controlled air requirement which is on a surface 60 of device 55 opposing a surface 61 of removable fragment 26. Fragment 26 has a receiving port 62 on the opposed surface 61 which communicates with corresponding orifices 48. Receiving port 62 and delivery port 58 are positioned to be off-center and the same distance from the axis of threaded hole 54. Inner seal 64 is lodged in groove 66 and circumscribes threaded hole 54 and nipple 56 but does not circumscribe receiving port 62 and delivery port 58. Outer seal 68 is lodged in groove 70 and circumscribes both delivery port 58 and receiving port 62. When device 55 is screwed into fragment 26 the opposed surfaces 60 and 61 engage and compress seals 64 and 68 so that a channel for passage of air is formed between port 58 and port 62 in the annular space between the inner and outer seals irrespective of the angular orientation of device 55 in threaded port 54.

Seals 74 and 76 are lodged in groves 78 in interface 42. Locking bolt 80 clamps seals 74 and 76 between surfaces 40 and 42 to complete an air passage between the opposed orifices of surfaces 40 and 42.

In operation, pneumatic control devices are screwed into threaded holes 54 to establish connections with manifold 22. Board 14 is then inserted and clamped in rack 12 to establish connections to both air source and air requirements. The assembly operation is extremely quick and inexpensive and the finished assembly offers a minimum of exposed tubing. The operation can be readily reversed to remove the board for repair or change or to replace the control devices.

What is claimed is:

1. An electro-pneumatic assembly device including a rack for receiving mounting boards, a removable mounting board for supporting components inserted in said rack and having a set of electric edge connectors along an edge thereof, an elongated pneumatic manifold split lengthwise into a stationary and a removable fragment, the stationary fragment being affixed to said rack and the removable fragment being affixed to said board, said stationary fragment having a source port for receiving air from a source affixed to said rack and a plurality of requirement ports for delivering controlled air requirements to points on said rack, said stationary and removable fragments having opposed mating interfaces extending along their long dimensions, said stationary fragment having in its mating interface a plurality of requirement orifices each communicating with a corresponding said requirement port of said stationary fragment, and a source orifice communicating with said source port, said removable fragment having orifices in its mating interface corresponding to and opposing the orifices in the mating interface of the stationary fragment, said removable fragment having a delivery channel communicating with said orifice in the removable fragment opposing the source orifice of the stationary fragment, said removable fragment having a plurality of control device ports communicating with said delivery channel and providing means for attachment of and the delivery of source air to a control device, said removable fragment having a receiving port associated with each said device port for receiving controlled air from a control device and communicating with an associated orifice in the mating interface of said removable fragment, said assembly device including a seal associated with each pair of opposed orifices effective in completing a channel for passage of air from one opposed orifice to its opposed counterpart.

2. Apparatus as claimed in claimed in claim 1, including a mechamism for clamping said fragments in a closely opposed position.

3. Apparatus as claimed in claims 1 or 2, wherein at least one of said control device ports is a threaded hole and a pneumatic control device is attached directly to said removable fragment by screwing into said threaded hole, said device and said removable fragment being shaped so that when the device is screwed into said threaded hole a surface of the device will be opposed to a surface of the removable fragment containing said receiving port, said threaded hole providing a channel for source air for said control device, delivery of controlled air from the device being provided by a hole off center with respect to said threaded hole said off-center hole being positioned a distance from the center threaded hole equal to the distance between the control device port and its associated receiving port, an inner circular seal being positioned between said device and said removable fragment and circumscribing said threaded hole but not said off-center hole and an outer circular seal positioned between said device and said removable fragment circumscribing said off-center hole providing a channel for flow of air between said off-center hole and its associated receiving port.

* * * * *